March 5, 1968 J. W. ROY ET AL 3,372,358

FILM TRANSFORMERS

Filed April 12, 1966

INVENTORS.
JAMES W. ROY
ANDRÉ SUNNEN
Isidore Togut
ATTORNEY 3,372,358
FILM TRANSFORMERS
James W. Roy, Morristown, and Andre Sunnen, Montclair, N.J., assignors to International Telephone and Telegraph Corporation, Nutley, N.J., a corporation of Maryland
Filed Apr. 12, 1966, Ser. No. 542,046
4 Claims. (Cl. 336—200)

ABSTRACT OF THE DISCLOSURE

This is an invention of a transformer having primary and secondary windings composed of conductive film disposed on a substrate having magnetic permeability properties.

This invention relates to film circuits and more particularly to substrates for printed circuits or thick films.

Printed circuits and thick films are known in the art to carry thereon passive devices, such as resistor, capacitor and inductive elements, which can be interconnected to form, with vacuum tubes or transistors, complete electronic circuits. The passive devices are deposited on the substrate, printed circuit board, ceramic plate or similar elements by known means, resistive ink for the resistors, conductive film areas separated by dielectric for the capacitors and conductive film in the form of a coil, round or otherwise, disposed on the flat substrate for the inductor. However, the magnetic field density for the inductor is produced solely by the current through the inductor film, since the substrate material is dielectric or insulating. It is desirable to provide a substrate containing ferro-magnetic material so that the magnetic flux density produced by current flow through the inductor coil would be many times greater than that of the insulating or dielectric substrate.

It is therefore an object of this invention to provide a substrate for film circuits having magnetically permeable material therein.

The above-mentioned and other features and objects of this invention will become more apparent by reference to the following description taken in conjunction with the accompanying drawings, in which.

Figure 1:
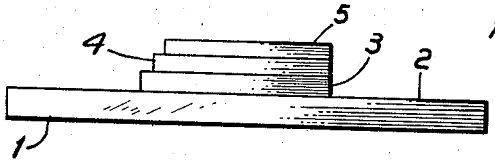
FIGURE 1 is a side elevation view of a film electronic component with a substrate having good insulation characteristics.
Figure 2:
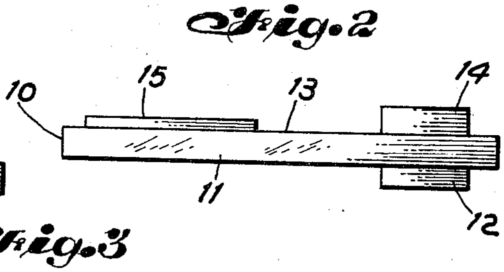
FIGURE 2 is a side elevation view of a film electronic component wherein the substrate is a good dielectric.

With reference to FIGURES 1 and 2, there is shown prior art film electronic components. In FIGURE 1, the substrate 1 is made of alumina which has good insulation resistance but poor dielectric characteristics. Resistive material (not shown) can be disposed on the surface 2 of substrate 1 as required. To form a capacitor thereon, however, it is necessary to first print or deposit a first electrode 3 of the condenser; then print or otherwise place on top thereof a film of dielectric 4 or a chip of dielectric, such as barium titanate, $BaTiO_3$. The barium titanate may be incorporated in a glass matrix to be used instead of the barium titanate chip referred to. On top of the dielectric is then deposited a second electrode 5 thus constituting a capacitor. The electrodes may be made of any suitable conductive film. An example is a platinum and glass conductive mixture.

Figure 3:
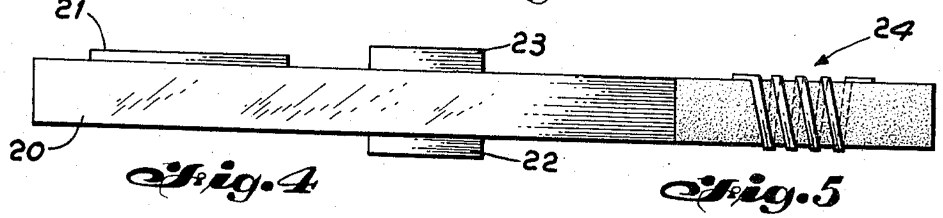
FIGURE 3 is a side elevation view of a thick film arrangement using the substrate of this invention.

In FIGURE 2 the substrate 10 may be formed out of barium titanate which has very good dielectric characteristics. In this case, it is sufficient to deposit on one side 11 of the substrate 10 a first electrode 12 and directly opposite on the other side 13 of the substrate 10 deposit a second electrode 14 thus constituting a capacitor. Similarly as above, the electrodes may be platinum and glass conductive material or anything else which provides a conductive film. Here again resistive material may be printed or deposited on the surface 13 to form a resistor 15. In both these cases, the prior art has disclosed, though not shown here, inductors which are formed by simply depositing conductive material in the shape of a coil on the surface and connecting it to other passive elements on the substrate. The disadvantage of merely having a coil disposed on top of an insulating material or a dielectric material is that it severely limits the magnetic flux density of the inductor. In some cases in order to increase the magnetic flux density it has been necessary to provide cores of magnetically permeable material around which the inductor coil can be disposed. The unique aspect of this invention is that there is provided in the substrate itself, and as an integral part thereof, the magnetically permeable material which in association with the printed turns of the inductor constitute an inductor having a much greater magnetic flux density than heretofore available. The novel substrate of this invention shown in FIGURE 3 as item 20 is a ferromagnetic ceramic substrate. This substrate can be made out of any ferrite material, an example being manganese zinc iron known as manganese zinc ferrite having the formula $MnO_2+Fe_2O_3+ZnO_2$. This material has a high dielectric constant where $k=10,000$ and a high insulation resistance, therefore, making this an ideal substrate having good dielectric characteristics, high insulation resistance and high magnetic permeability. As shown in FIGURE 3, the resistor 21 can be deposited by methods known to the art. Capacitor electrodes 22 and 23 can be disposed on opposite sides of the substrate 20. The inductor 24 in the most simple form can be made by simply printing a coil which extends continuously around the substrate 20; as shown it is the form of a helix. The characteristics of the inductor 24 can be varied as required according to the number of turns and inductance required thereof. It is to be understood that while the inductor 24 is shown as extending around the substrate it may be made as a coil deposited on one side of the substrate.

Figure 4:
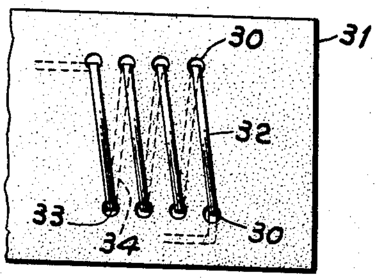
FIGURE 4 is another embodiment of the substrate of this invention.

FIGURE 4 shows another form of inductor wherein holes 30 may be drilled through the substrate 31 in the proper spacing and number and the printed lines 32 disposed on the surfaces and going through the holes as shown at 33 and then continuing on the opposite side as shown by the broken lines 34. It is also possible to deposit the conductive material over the whole inner surface of the hole which connect to the lines on both sides of the substrate. Interconnections between the inductor and the other elements of the circuit can be made by conventional printed technique. Another embodiment of this invention shown in FIGURE 5 discloses an inductor 40 with the printed turns 41. In this embodiment, a long rectangular opening 42 is made on either side of the substrate 43 and then the printed turns are disposed first on one side, as shown in FIGURE 5, then along the wall 44 of each slot 42 as illustrated by the thickness of the line 45 and then on the opposite side.

Figure 5:
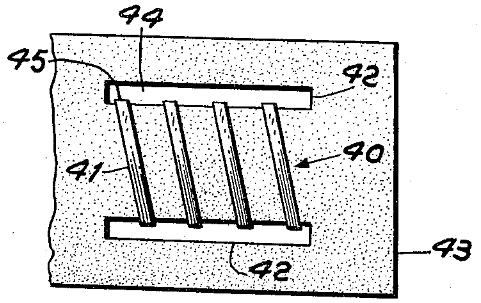
FIGURE 5 is still another embodiment of the substrate of this invention.
Figure 6:
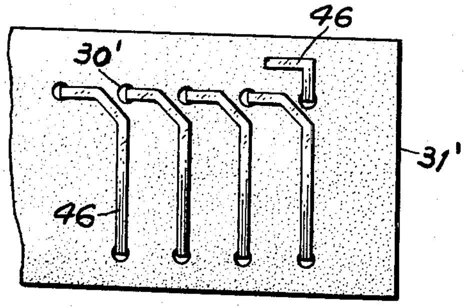
FIGURE 6 is a further embodiment of the novel substrate.

With reference to FIGURE 6 there is shown an embodiment of the novel substrate where the inductive winding need not be in the form of a helix as illustrated in FIGS. 4 and 5. Holes 30' are made in the substrate 31' as shown in FIG. 4. The conductive lines 46 are then printed on both sides of the substrate and through the holes 30' to form a winding pattern as shown.

Figure 7:
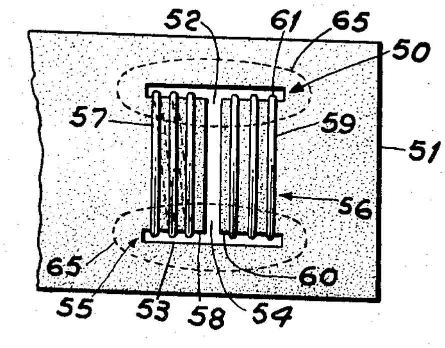
FIGURE 7 is a film pot core inductor using the substrate of this invention.

In FIGURE 7, there is shown an embodiment of a pot core inductor with an air gap introduced in the flux path of the highly permeable material. A slotted opening 50 is made on the substrate 51 in the form of an H. The sides of the H, 52 and 53, are connected by a slot 54 perpendicular thereto. One winding 55 is disposed, as shown in the left-hand branch, and the second winding 56 is in the right-hand branch of the transformer. The turns 57 are printed on the substrate portion 58 in the same manner as described for the inductor of FIGURE 5. The turns 59 are similarly printed on the substrate portion 60. In this embodiment instead of printing the lines which go through the substrate from one side to the other on a flat surface, there is shown another method which consists in making a shallow indentation 61 in the substrate wall which is of a width equivalent to the width of the printed turn so that in effect the indentation 61 serves as a guide for the continuation of the printed line through the thickness of the substrate 51. The width of the slot 54, or air gap determines the total flux of the inductor and of course may be varied as is required. Broken lines 65 show one of the flux lines for this embodiment. Connections to the winding may be made in any known fashion.

Figure 8:
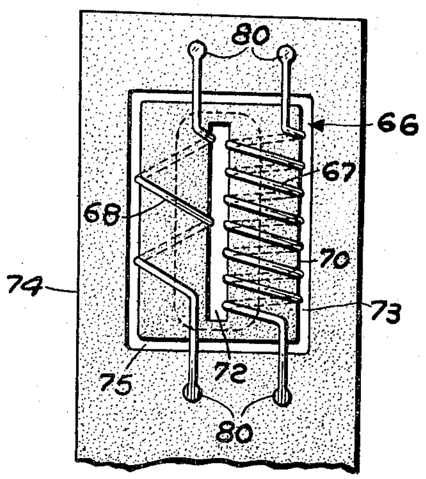
FIGURE 8 is an embodiment in the form of a transformer.

FIGURE 8 discloses an embodiment of this invention in the form of a transformer 66. Dependent upon whether a step-up or step-down transformer is desired winding 67 and 68 are interchangeable primary or secondary windings. These windings are wound as described above on a magnetically permeable substrate 70 which has a rectangular slot 71. The flux path is denoted by the broken line 72. The transformer 66 may then be disposed in an opening 73 in a substrate mounting 74, leaving a gap 75. The substrate may be either magnetically permeable material or not; if not magnetically permeable material the gap 75 may be omitted. The transformer 66 may be mounted on the substrate 74 by means of the winding leads 80.

Further, combining a trimmable inductor as shown in FIG. 7 with a capacitor as suggested in FIG. 3 results in an LC filter utilizing the characteristics of the substrate of this invention.

The thickness of the substrate as it affects the cross section of the magnetic path determines the reluctance of the inductor. Variations of the thickness may be made as required; the substrate may be grooved to a desired depth to receive the inductor lines.

While I have described above the principles of my invention in connection with specific apparatus, it is to be clearly understood that this description is made only by way of example and not as a limitation to the scope of my invention as set forth in the objects thereof and in the accompanying claims.

We claim:

1. A transformer having primary and secondary windings comprising:
   - a substrate having magnetic permeability properties;
   - a first slot in said substrate;
   - a second slot in said substrate parallel to said first slot;
   - a third slot in said substrate joining said first and said second slots normal to said first and said second slots forming between said first and said second slots a first substrate portion on one side of said third slot and a second substrate portion on the other side of said third slot;
   - said primary winding comprising a conductive film disposed on said substrate in a continuous winding pattern surrounding said first substrate portion;
   - said secondary winding comprising a conductive film being disposed on said substrate in a continuous winding pattern surrounding said second substrate portion;
   - said third slot forming an air gap between said primary and said secondary windings, the width of said air gap determining the total flux of said transformer.
2. A transformer according to claim 1 wherein said substrate material is composed of manganese zinc ferrite.
3. A transformer according to claim 1 wherein said conductive film comprises a thick film.
4. A transformer according to claim 1 wherein said conductive film comprises a printed circuit.

References Cited

UNITED STATES PATENTS

| | | | |
|---|---|---|---|
| 3,115,581 | 12/1963 | Kilby | 317—101 |
| 3,160,576 | 12/1964 | Eckert | 252—62.5 |
| 3,169,115 | 2/1965 | Akashi et al. | 252—62.5 |
| 3,180,833 | 4/1965 | Pierrot et al. | 252—62.5 |
| 3,185,947 | 5/1965 | Freymondssen | 336—200 |
| 3,252,913 | 5/1966 | Van Gils | 252—62.5 |

LARAMIE E. ASKIN, *Primary Examiner.*

J. R. SCOTT, T. J. KOZMA, *Assistant Examiners.*